United States Patent
Ryan et al.

(10) Patent No.: US 7,570,127 B2
(45) Date of Patent: Aug. 4, 2009

(54) METHOD AND SYSTEM FOR SPUR SUPPRESSION IN MODULATORS

(75) Inventors: Gerald P. Ryan, Geneva, IL (US); Ubaldo Cepeda, Oswego, IL (US)

(73) Assignee: ARRIS Group, Inc., Suwanee, GA (US)

(*) Notice: Subject to any disclaimer, the term of this patent is extended or adjusted under 35 U.S.C. 154(b) by 69 days.

(21) Appl. No.: 11/943,920

(22) Filed: Nov. 21, 2007

(65) Prior Publication Data
US 2008/0116987 A1 May 22, 2008

Related U.S. Application Data

(60) Provisional application No. 60/860,436, filed on Nov. 21, 2006.

(51) Int. Cl.
*H03C 1/52* (2006.01)
*H03C 1/60* (2006.01)
(52) U.S. Cl. ............... 332/162; 332/170; 375/296; 455/109; 455/114.2
(58) Field of Classification Search ............ 332/159, 332/162, 170; 375/285, 296; 455/47, 63.1, 455/109, 114.2
See application file for complete search history.

(56) References Cited

U.S. PATENT DOCUMENTS 6,658,065 B1 * 12/2003 Della Torre et al. ......... 375/296

* cited by examiner

*Primary Examiner*—David Mis
(74) *Attorney, Agent, or Firm*—Troy A. Van Aacken; Robert J. Starr

(57) ABSTRACT

An IF receiver receives a tapped portion of a modulated communication signal. A processor, local with respect to the IF receiver, receives an interrupt from a main processor instructing it to evaluate the power levels of desired and undesired components of the communication signal. The interrupt may be sent for a variety of reasons, such as according to a predetermined schedule, or in response to changes in a communication network, such as new equipment installation and temperature changes. The local processor instructs the IF receiver to tune it's LO so that the evaluation range of the receiver and feedback loop to parameter-adjustable components includes the frequency, or frequencies, of a specified signal component. The local processor evaluates the power level of the specified signal component. Based on the evaluation, the local processor instructs parameter-adjustable signal processing components to alter parameters to optimize characteristics of the communication signal for transmission.

20 Claims, 7 Drawing Sheets

US 7,570,127 B2

METHOD AND SYSTEM FOR SPUR SUPPRESSION IN MODULATORS

CROSS REFERENCE TO RELATED APPLICATION

This application claims priority under 35 U.S.C. 119(e) to the benefit of the filing date of Ryan, et. al., U.S. provisional patent application No. 60/860,436 entitled "Method and system for spur suppression in modulators," which was filed Nov. 21, 2006, and is incorporated herein by reference.

FIELD OF THE INVENTION

This invention relates, generally, to communication networks and, more particularly, to dynamically and automatically adjusting parameters of parameter-adjustable components in a modulator circuit to optimize suppression of unwanted signal components.

BACKGROUND

Single Sideband ("SSB") modulators offer an efficient means of upconversion of a signal's frequency. This is because SSB modulators provide a method of upconversion where one of two sidebands are suppressed. This is unlike traditional Double Sideband ("DSB") upconversion where both sidebands are at similar power levels after the conversion. Compare FIG. 1 to FIG. 2 below:

The apparent difference between the two upconversion schemes is that in the SSB upconversion, the power level of one of the sidebands is lower. The local oscillator ("LO") bleed through power is also lower in SSB modulation schemes. At the heart of an SSB scheme is an I/Q modulator which takes advantage of the nature of complex signals to suppress the unwanted sideband and LO power during upconversion.

Turning now to FIG. 3, a SSB modulation system 2 typically includes a complex I/Q modulator 4. A complex DAC 6 feeds signals that are nominally 90 degrees out of phase with one another at input of modulator 4. Complex digital to analog converter ("DAC") 6 receives its signal input from some form of a channel processor 8—in the case shown in the figure, a field programmable gate array ("FPGA"). Channel processor 8 typically performs operations such as placing communication signals in a baseband frequency arrangement, such as, for example, placing multiple communication channels at center frequencies spaced 6 MHz apart.

Even though the unwanted sideband and LO bleed through are reduced using a SSB system, the output, of the I/Q modulator is passed through a high Q (quality factor) filter 10 to ensure specification compliance. At the end of the chain is typically an output stage 12 that places a modulated communication signal, or signals, onto a communication network. It will be appreciated that although FIG. 3 shows stage 12 as an amplifier, the output stage may also include other components, such as, for example, a mixer for further frequency conversion, variable attenuators, or other signal conditioning components. Furthermore, FIG. 3 shows the output of stage 12 coupled to a RF connection port, which may connect the circuitry to the left of it to a network, such as, for example, a cable television network, a cellular telephone network, a satellite communication network, or a over-the-air broadcast network (i.e., an antenna).

Without describing details of the complex math, which one skilled in the art would know, the key to the sideband suppression, and the LO rejection is the balance between the amplitude and phase of the I and Q signals 14, as well as their common mode voltages. One way to optimize these parameters (amplitude, phase and common mode voltage) is to perform a calibration procedure, where corrections are made, and the effects measured with external equipment. The exact gain and phase settings are stored in memory for use in the exact circumstances under which they were determined. This can provide good results, but there will typically be degradation over time due to the effects of aging, temperature, and drift in any associated drive circuitry (DAC gain, LO power, etc.).

DETAILED DESCRIPTION

As a preliminary matter, it readily will be understood by those persons skilled in the art that the present invention is susceptible of broad utility and application. Many methods, embodiments and adaptations of the present invention other than those herein described, as well as many variations, modifications, and equivalent arrangements, will be apparent from or reasonably suggested by the present invention and the following description thereof, without departing from the substance or scope of the present invention.

Accordingly, while the present invention has been described herein in detail in relation to preferred embodiments, it is to be understood that this disclosure is only illustrative and exemplary of the present invention and is made merely for the purposes of providing a full and enabling disclosure of the invention. The foregoing disclosure is not intended nor is to be construed to limit the present invention or otherwise to exclude any such other embodiments, adaptations, variations, modifications and equivalent arrangements, the present invention being limited only by the claims appended hereto and the equivalents thereof.

Figure 1:
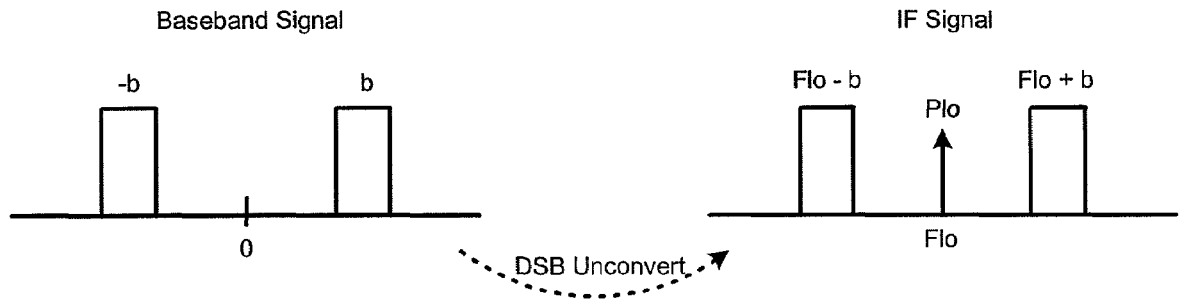
FIG. 1 illustrates a signal spectrum comparing baseband signals with their corresponding, upconverted, IF signals in a dual sideband modulation scheme.
Figure 2:
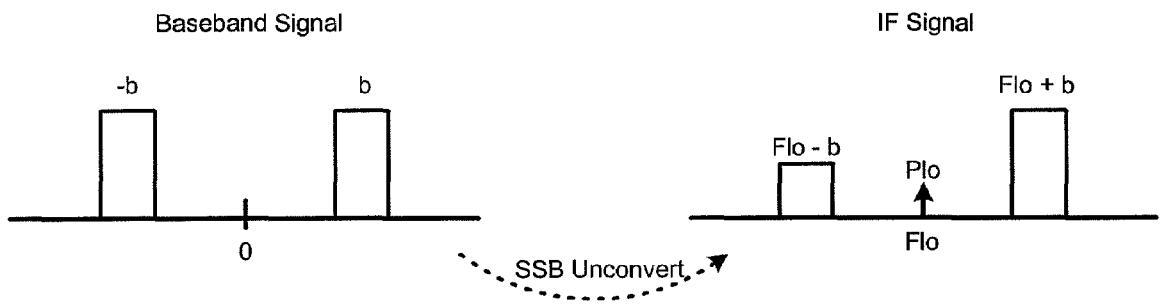
FIG. 2 illustrates a signal spectrum comparing baseband signals with their corresponding, upconverted, IF signals in a single sideband modulation scheme.
Figure 3:
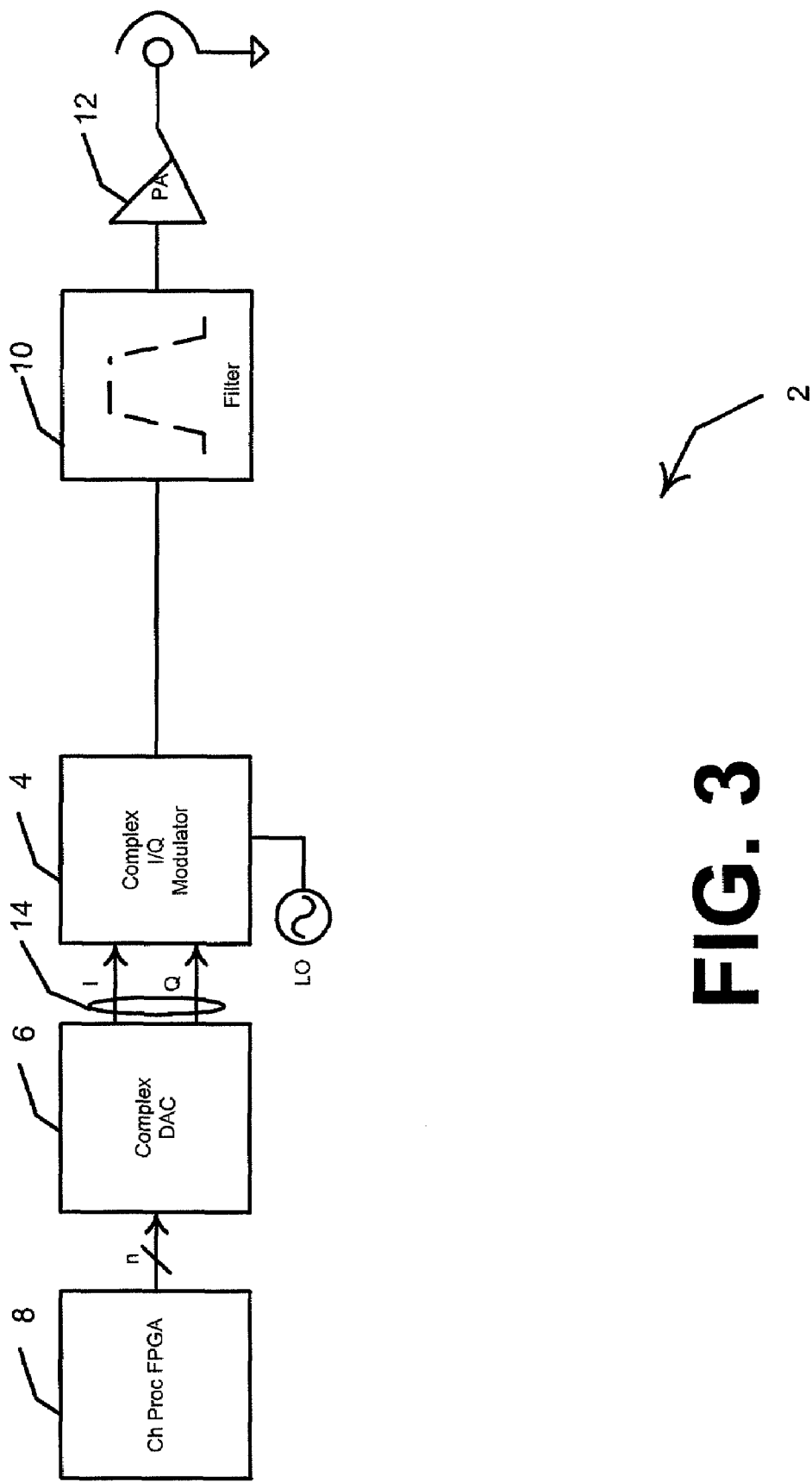
FIG. 3 illustrates a system for performing single sideband modulation upconversion of a signal, or signals, of a communication channel.
Figure 4:
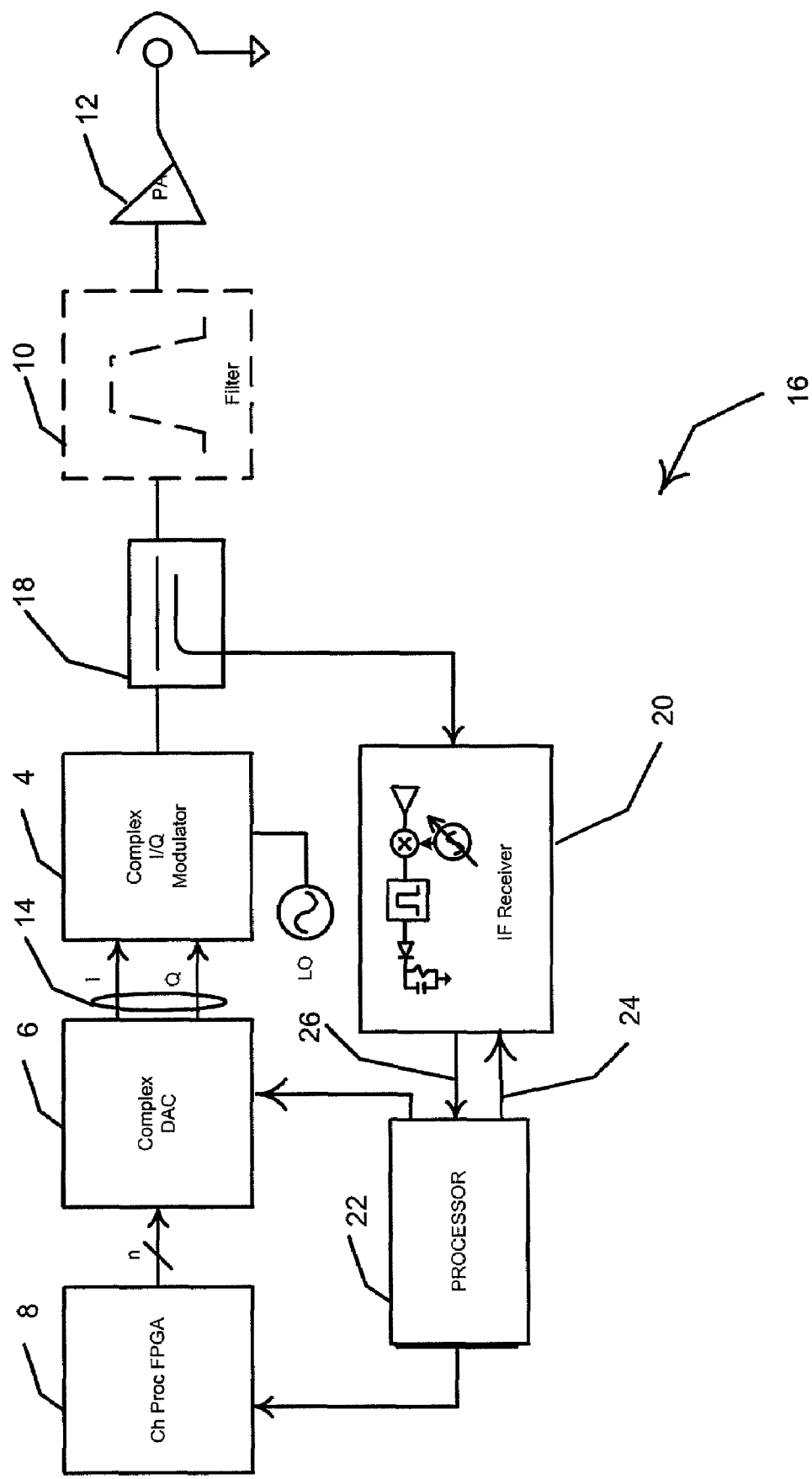
FIG. 4 illustrates a system of performing single sideband modulation upconversion using dynamic detection and automatic changing of sideband power levels.

As good as it performs, the SSB upconverter can be further improved by adding the ability to automatically self calibrate. Turning now to FIG. 4, a system 16 is shown for automatically adjusting modulation parameters in response to detected power levels of sidebands. System 16 includes many components from the system shown in reference to FIG. 3. System 16 adds certain components to system 2 shown in FIG. 3. The system with the added components is shown in FIG. 4. Returning to discussion of FIG. 4, tapping means 18 is inserted in the signal path between a signal output of modulator 4 and filter 10. Tap 18 may be a diplexer, a splitter, a coupler, or a tap, or other similar device know in the art for removing a portion of a signal from a signal path and providing it at a tapped output while passing the remaining portion.

Tap 18 splits off a portion of the modulated/upconverted signal from the output of modulator 4 and provides the tapped portion to a signal input of IF receiver 20 from a tapped signal output. The receiver is coupled to local RF processor 22, which may include, for example, a micro processor, via a send line 24 and a receive line 26. Processor 22 instructs IF receiver 20 to adjust it's LO so that the resulting beat frequency between it's LO and the center of a desired, or first, signal component of the tapped signal output from modulator 4 is the center of a predetermined receive detection window. Then, processor 22 samples the power level of the frequency range being evaluated and stores the sampled power level value to a memory, which may include a register on the processor, or another memory coupled to the processor.

In an aspect, local RF processor 22 directs receiver 20 to adjust its LO so the beat frequency is at the center of the predicted undesired, or second, signal component frequency range of the modulated signal output from modulator 4, and then samples and stores the second signal component's power level as described with respect to the signal component frequency range. Receiver 20 can also be directed to adjust it's LO frequency so that the beat frequency between it and the modulated signal is the center of the detection window that encompasses the LO of modulator 4. Thus, for example, processor 22 can specify the evaluation range of frequencies by instructing receiver 20 to adjusts its LO frequency so that the evaluation range covers either a desired signal component, i.e. a desired sideband, or an undesired signal component, i.e. an undesired sideband frequency or the LO frequency of modulator 4.

After sampling the power levels of the sidebands, the processor determines if the ratio between the power levels is optimized for transmitting the modulated signal received from the output of modulator. If the ratio is already optimal, then no further action is taken. It will be appreciated that the term optimal refers to maximizing the difference between the power level of the desired sideband compared to the power levels of an undesired sideband and other unwanted signal components, for example, LO frequency bleed through from the LO of modulator 4, it being understood that it is desirable for the power level of the undesired signal components to be as low as possible with respect to the power level of the corresponding desired component, or sideband. If, however, processor 22 determines, based on a predetermined criteria, that adjustment should be made to the modulated signal from modulator 4 to obtain optimal results, the processor, through control lines that couple it to FPGA 8 and DAC 6, directs the FPGA and/or DAC 6 to slightly adjust their operating parameters so that the modulated signal from modulator 4 is altered slightly. The iterative process of sampling and adjusting continues until the desired/optimal balance of relative sideband power levels is attained for the present network conditions.

For example, processor may instruct DAC 6 to adjust the phase shift between the I and Q signals 14 so that they are out of phase by more or less than 90 degrees. Or, the common mode voltage of signals 14 may be raised or lowered in response to instructions from processor 22. Similarly, FPGA 8 may alter its algorithm that conditions the modulating signal it outputs in response to instruction from processor 22.

Thus, generally, the improved implementation above adds IF sampling receiver 20 to a basic SSB upconverter. Receiver 20 is frequency agile, and can tune from the lowest possible lower sideband, to the uppermost upper sideband. This capability allows both the undesired components (the unwanted sideband, and the LO of modulator 4) and the desired components (desired sideband) present at the signal input to IF receiver 20 to be measured for comparison.

Such IF measurements can be passed to the channel processor 8 to create a feedback loop. In doing so, a cancellation algorithm can be realized that reduces undesired components. The channel processor can adjust the gain and the phase of the I and Q DAC channels, or their common mode voltages, and measure the corresponding improvement (or degradation) of the unwanted sideband, and LO suppression. Corrections would continue in an iterative manner until an acceptable solution is obtained. The correction process can be ran at power up, and also during normal operation.

IF filter 10 in FIG. 4 is shown as a broken line because it is conceivable that a high Q IF filter may be unnecessary. At a minimum, the filter can have a much lower Q, or be a discrete stage. This is because the LO and unwanted sideband levels are controlled dynamically via the novel correction process described in reference to and performed by system 16. This results in an increased IF bandwidth allowing for greater frequency agility. It also reduces the passband distortion, which results in greater unequalized modulation quality. Better unequalized modulation quality means that the process of predistortion can be greatly simplified if not eliminated altogether.

It will be appreciated that processor 22 is shown in FIG 4 as a discrete processor. However, it will be appreciated that the functions and operations performed by processor 22 may be included in channel processor circuitry 8.

Another benefit of the IF receiver and feedback control loop is that performance can be monitored over time, and adjustments made as necessary. Should a unit be uncorrectable, the operator could be made aware of the situation. Thus, the combination of the IF receiver and the feedback control loop functions as a long term diagnostic mechanism.

Another possible implementation is channel balancing for multiple channel applications. The desired individual channel's powers can be measured and set with respect to one another. Finally, a possible method for flattening the single channel power slope is made available provided the receiver filter bandwidth is sufficiently small compared to the channel bandwidth.

Figure 5:
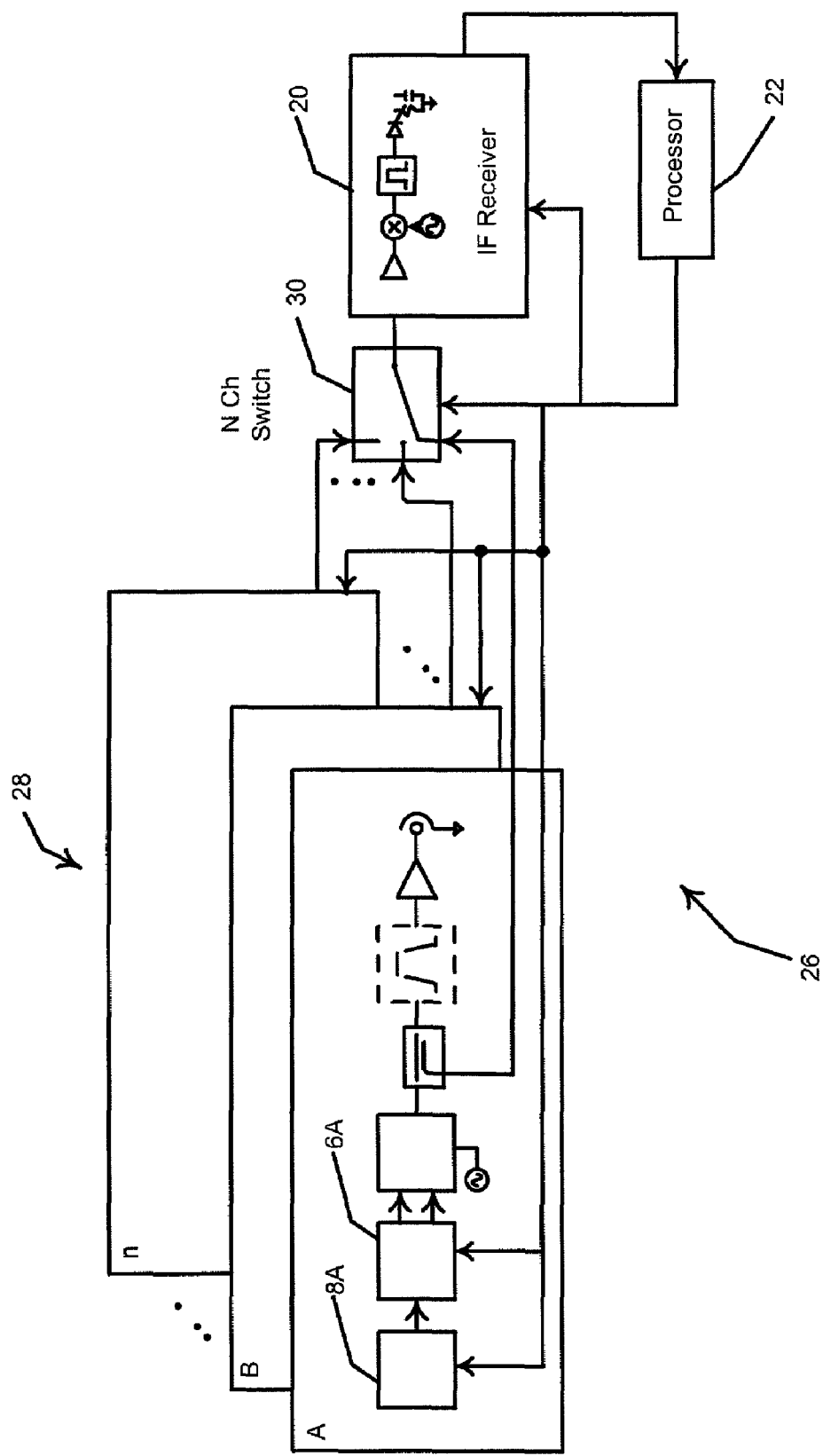
FIG. 5 illustrates a system of performing single sideband modulation upconversion using dynamic detection and automatic changing of sideband power levels in a multi-channel modulation arrangement.

In yet another aspect, IF sampling receiver 20, and related processing components, can be shared among many transmitters as may be used in, for example, a multi-port transmitter communication system like a cable modem termination system ("CMTS") cable access module card. A diagram of how such a system 26 might work as shown in FIG. 5. A multi-transmitter switch 30 couples the tapped portion of each of a plurality of modulator circuits, or circuit cards, ("circuit/card") to a single IF receiver 20 and its associated processing circuitry. Switch 30 allows processor 22 and receiver 20 to monitor and dynamically adjust the signal parameters of the modulating signals of each of the modulating/transmission circuit/cards 28A-n individually in response to corresponding measured signal component power levels from the individual circuit/cards. Processor 22 may use a protocol known in the art, such as, for example, $I^2C$ or Serial Peripheral Interface, to communicate with parameter-adjustable components such as the channel processors FPGA 8A-n and the DAC 6 A-n For example, FPGA 8A and DAC 6A will act on an instruction intended for card 28A. Thus, a single IF receiver circuit 20 can be shared by multiple transmission modulator cards/circuits 28A-n to manage and optimize the desired and undesired signal component's power levels in the multiple channels sent by each of the multiple cards, or circuits.

Figure 6:
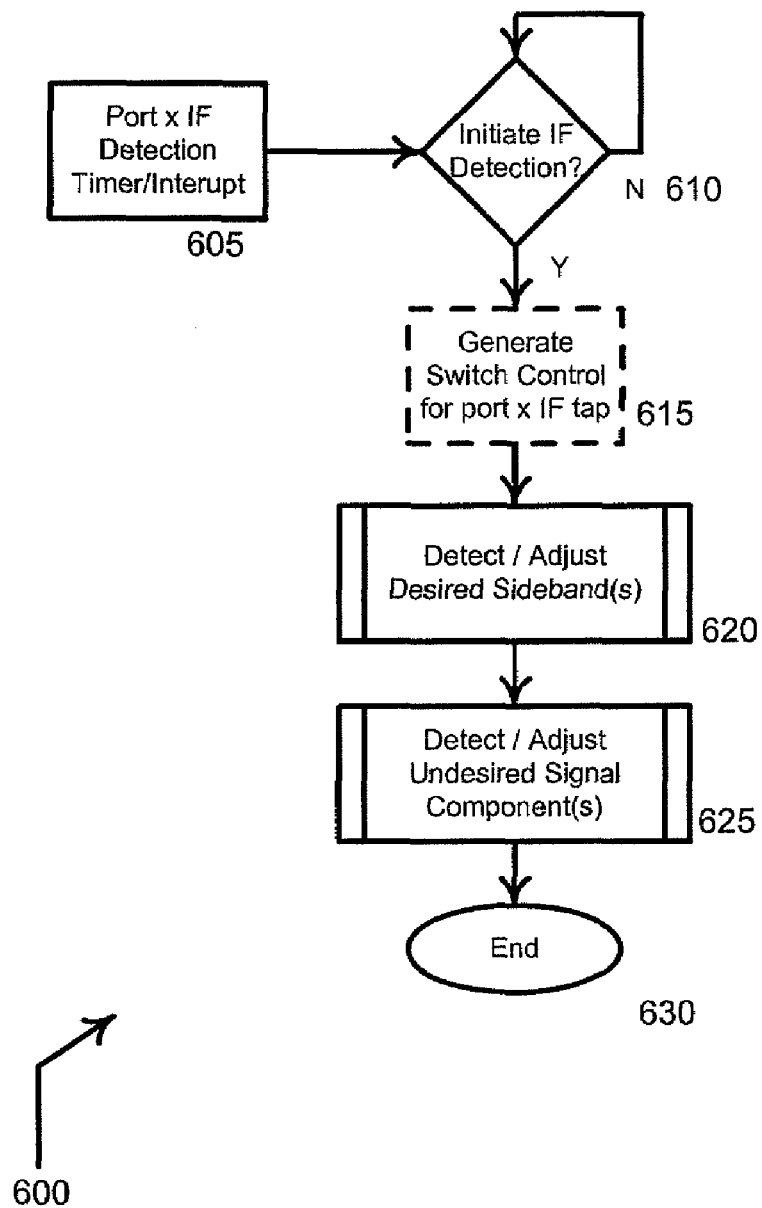
FIG. 6 illustrates a flow diagram of an overall method for optimizing sideband suppression in a communication system.

Turning now to FIG. 6, a flow diagram of a method 600 for optimizing and managing the power levels of signal components in a modulated communication signal is illustrated. Method 600 begins at step 605 with the receipt of a port IF detection timer/interrupt. The interrupt may be an interrupt from a main processor, for example, a processor that manages operation of a cable modem termination system ("CMTS") at a multiple services operator's head end. The interrupt is received at a local RF processor that is local with respect to one or more transmit/signal modulators cards/circuits.

At step 610, a determination is made whether an IF detection interrupt has been, received at the local processor. If not, the local processor may continue in a wait state with respect to performing optimizing steps until an interrupt is received. If the local processor determines that a IF detect interrupt has been received, it may activate certain circuits that have been idle, for example an LO circuit of IF receiver 20 as shown in reference to FIG. 4. At step 615, the local processor instructs the multi-transmitter switch to couple a specified transmitter/modulator card/circuit by generating a switch control instruction. The switch responds to the switch control instruction, couples the specified transmitter/modulator circuit/card and method 600 advances to 620.

At step 620, the local processor manages the evaluation and adjustment of the relative power levels (relative to one another) of all of the channels from all of the transmitter/modulator cards/circuits that can be coupled via the multiple card switch 30 as shown in reference to FIG. 5. The details of subroutine 620 are described in reference to FIG. 7 below. Continuing with the description of FIG. 6, after the relative power levels of the desired signal components (i.e., desired sideband) of the modulated signals from all circuit/cards have been optimized, subroutine 625 manages and optimizes the power levels of undesired signal components (i.e., undesired sidebands and LO frequency bleed through of modulator's 4 LO shown in reference to FIGS. 4 and 5, for example). After the local processor completes step 625, the details of which are described in reference to FIG. 8, method 600 ends.

It will be appreciated that in a multiple transmitter/modulator circuit/card environment, the switch control instruction will be carried out during the step represented by step 615, and that during performance of the steps within subroutines 620 and 625, switch 30 shown in reference to FIG. 5 will be operated according to the switch instruction generated at step 615, assuming that the system which method 600 is optimizing and managing is a multi-circuit/card system.

As described above in reference to FIG. 4, the local, processor 22 may be a discrete processor, or the processor functionality may be embodied in the FPGA channel processor 8. A switch control instruction may be used to couple a multi channel switch, as described above in reference to FIG. 5, to a particular channel card port. It will be appreciated that step 615 described in reference to step 615 illustrated in FIG. 6 below may be optional, as a system may not be configured for a single IF receiver to operate with multiple channel ports. If a communication system is not so configured, step 615 will not be performed, thus it is shown in the figure with dashed lines to indicate it is optional depending on the configuration of the communication system.

Figure 7:
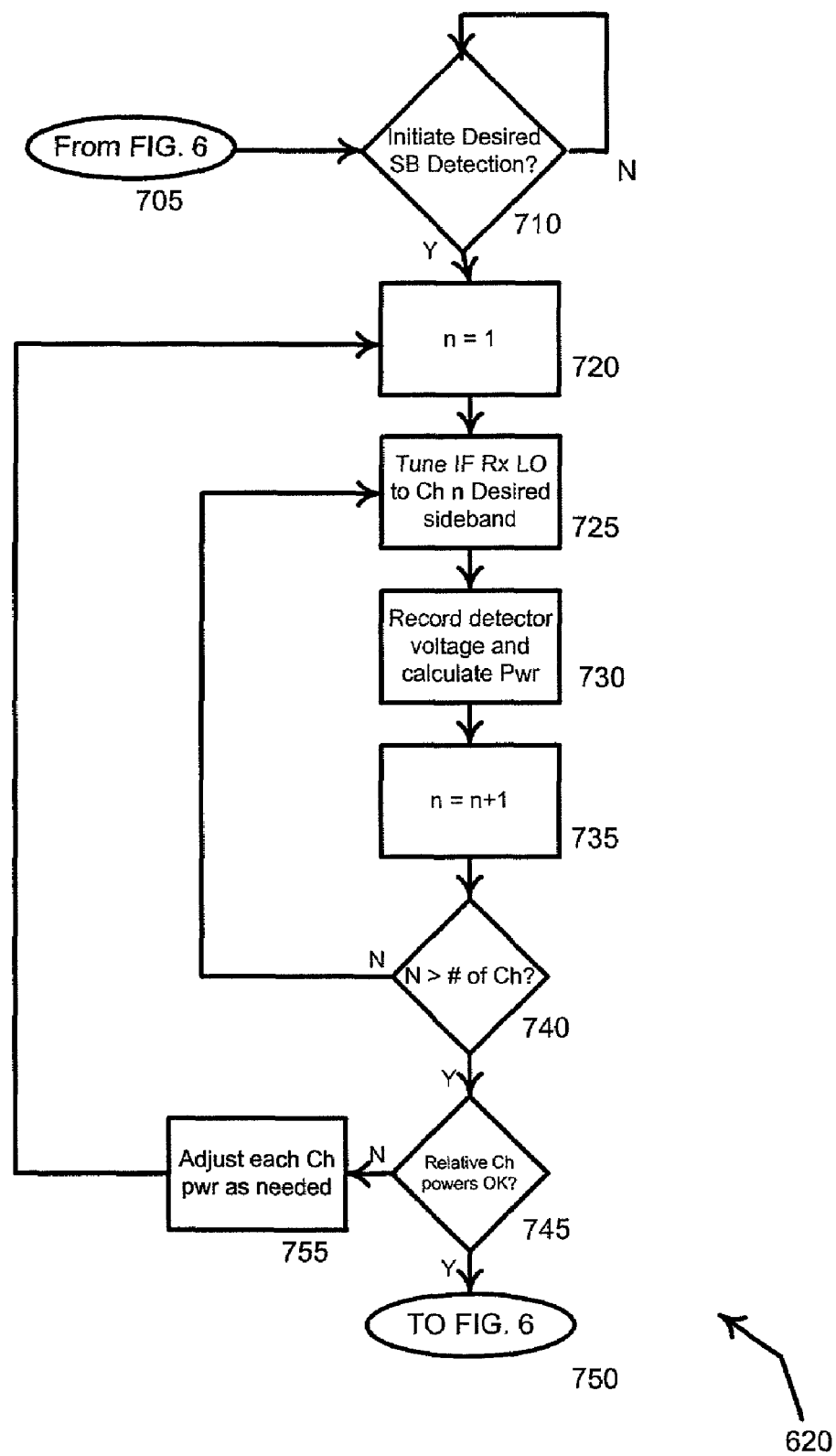
FIG. 7 illustrates a flow diagram of a method for automatically and dynamically adjusting the desired sideband power level of a communication signal.

Turning now to FIG. 7, a flow diagram of a method 620 for optimizing sideband power levels in a communication system is illustrated. A master processor initiates method 620 as described in reference to FIG. 6; control is received from method 600 at step 705, typically by receiving a power level detect interrupt at a local processor device. Software that executes as a result of the interrupt instructs the local processor to cause evaluation of a desired sideband power level. At step 710, the local processor determines whether a desired sideband signal power level interrupt has been received. If not, the local processor continues monitoring for receipt of such an interrupt. If a power level detect interrupt has been received at the local processor it activates certain circuit components, such as, for example, the LO of the IF receiver, that may presently be idle. Then, the method advances to step 720.

The local processor initializes a counter at step 720. At step 725, the local processor causes the local oscillator of an IF receiver that is coupled to a tapping means to tune so that the beat frequency between the tapped signal and the LO of the IF receiver is at the center of a predetermined receive detection widow. Tuning an LO to isolate certain signal frequencies is known to those skilled in the art and need not be described in further detail.

At step 730 the local processor converts the detector voltage of the IF receiver to a digital value and stores the value to a memory location, which may be part of the local processor or discrete with respect thereto. After the detector voltage level has been recorded, the counter variable n is incremented at step 735 and a determination is made at step 740 whether n equals the maximum number of channels to be evaluated. It will be appreciated that even if only one channel port is used in a given system, and thus optional step 615 in FIG. 6 is not performed, a system typically transmits multiple channels from a single port. Thus, the determination at step 740 is performed even if step 615 was not.

If the result of the determination at step 740 is no, then method 700 returns to step 725 and proceeds as described above. If the determination at step 740 is yes, meaning that n equals the maximum number of channels used in the communication system, a determination is made at step 745 whether the relative power levels of each of the desired sideband signals corresponding to their respective channels are at a predetermined target power level relative to each of the others. If the determination made at step 745 is that the relative power level of the desired sidebands of each of the respective channel signals does not match a predetermined level relative to the other channels, then process 625 advances to step 755.

At step 755, the local processor causes adjustments to be made to the power level of each channel so that the power levels of each channel's desired sideband meet the predetermined levels. The local processor typically instructs only the channel processor FPGA, as described, relative to FIG. 4, to adjust the levels of the various channel signals from its output. After the adjustments have been made, method 620 returns to step 720 and continues as described above to verify that the adjustments made by the channel processor result in the target relative power levels between the desired sidebands of the channels. When the predetermined relative power level values are achieved, method 620 advances to step 750 and returns to method 600 shown in FIG. 6.

Figure 8:
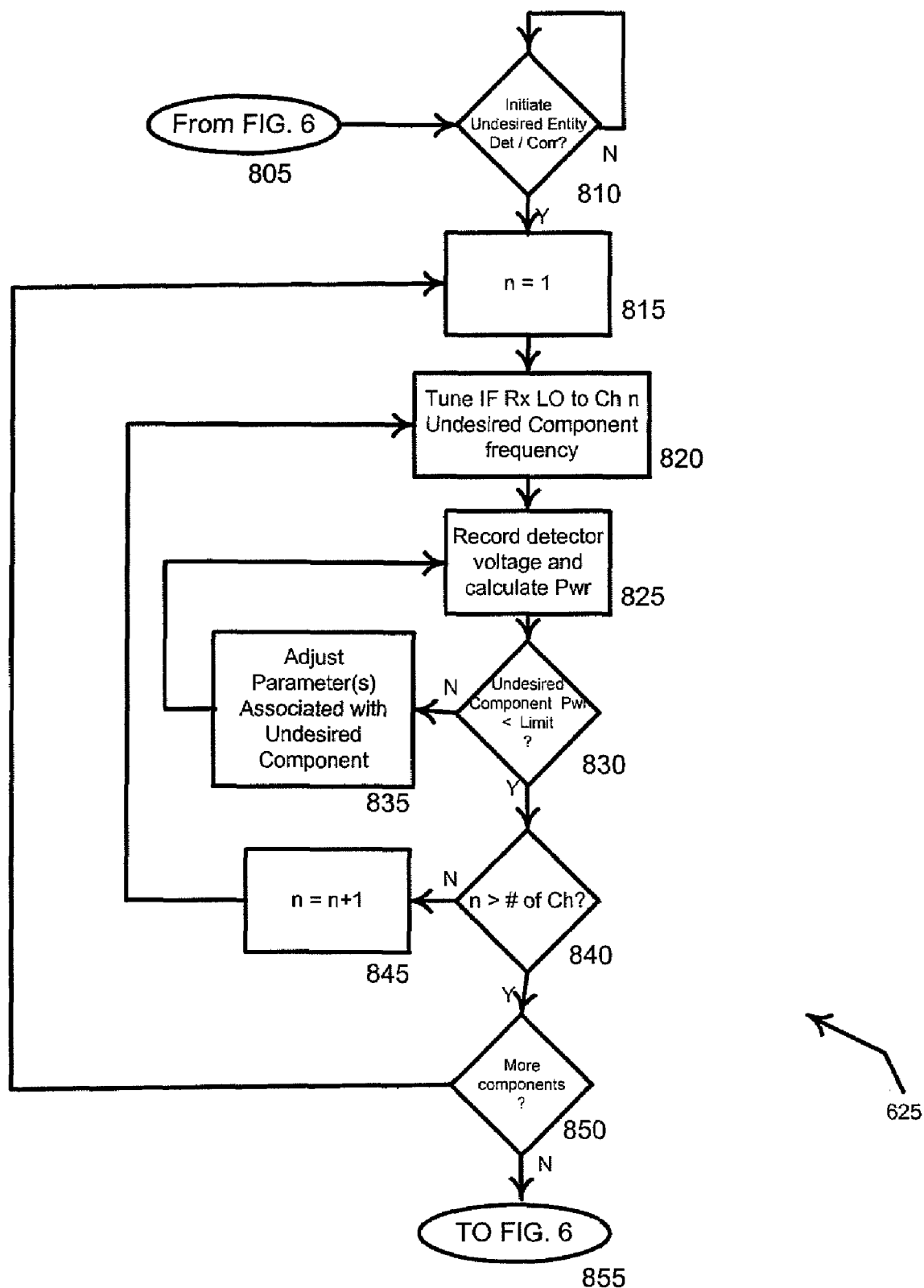
FIG. 8 illustrates a flow diagram of a method for automatically and dynamically adjusting the power levels of undesired signal components of a communication signal.

Turning now to description of FIG. 8, a flow diagram is illustrated for a method 625 for optimizing sideband power levels by reducing power levels of unwanted signal components, such as, for example, undesired sideband signals, LO bleed through signal, or any unwanted spurious signal power. Software that executes as a result of an interrupt from a master processor initiates method 625 as described in reference to FIG. 6; subroutine 625 begins at step 805.

At step 810, the local processor determines whether an undesired signal component power level interrupt has been received. If not the local processor continues monitoring for receipt of such an interrupt. If a power level interrupt has been received at the local processor it activates certain circuit components, such as, for example, the LO of the IF receiver, that may have been idle. It will be appreciated that the LO may be active already since step 625 immediately follows step 620 in FIG. 6. However, an operator of communication equipment using the systems shown in FIGS. 4 and/or 5 may choose to idle the LO for a short period while it is not needed. After step 810 the method advances to step 815.

At step 815, the local processor initializes a counter to be used to compare to the total number of channel frequencies to be evaluated. At step 820, the local processor causes the local oscillator of an IF receiver coupled to a tapping means to tune to a frequency selected so that the beat frequency between the undesired signal components of the tapped signal and the LO of the IF receiver is at the center of a predetermined receive detection widow. It will be appreciated that the main processor can predict the frequencies of the undesired signal components based on the channel center frequency and the LO of the modulator, which may be under control of the main processor (similar intelligence applies with respect to predicting the frequency of the desired sideband signal above with respect to step 725 discussed in reference to FIG. 7). At step 825 the local processor converts the detector voltage of the IF receiver to a digital value and stores the value to a memory location, which may be part of the local processor or discrete with respect thereto.

After the detector voltage level for a given LO frequency of the IF receiver has been recorded, a determination is made at step 830 whether the detected and recorded power level of the undesired component is less than a predetermined limit. If the detected power level of the undesired signal component is not less that the limit, the local processor instructs the channel processor FPGA and the DAC to which it is coupled to adjust their respective parameters that can alter signal characteristics, and then the power level of the undesired component of the altered signal is detected and recorded at step 825. It will be appreciated that the metric actually detected and recorded is typically a voltage level of the detected signal component, and the local processor converts the voltage level to a power value based on a conversion factor that may be determined upon calibration at the factory that manufactures the device that uses the system shown in FIGS. 4 or 5. Parameters may be adjusted in the channel processor FPGA and/or DAC to alter signal characteristics such as common mode voltage for the undesired LO signal component, or the phase and amplitude relationship between the I and Q components of the signal being modulated.

When the result of the determination at step 830 is that the power level of the undesired signal component is less than the predetermined limit associated with it, method 625 advances to step 840. At step 840 the local processor determines whether all of the total number of channels to be evaluated has been evaluated, by comparing the counter value 'n' to the total number of channels to be evaluated. If all channel frequencies have not been evaluated, then method 625 advances to step 845 and the local processor increments counter value 'n' before returning to step 820.

If the local processor has completed evaluation of power levels of the undesired component for all of the channels, method 625 advances to step 850 and a determination is made whether a main processor has instructed the local RF processor to evaluate another undesired component. If so, method 625 returns to step 815. If there are no more undesired component power levels to evaluation, method 625 ends and control returns to method 600 shown in FIG. 6.

It will be appreciated that the above aspects are described in the context of the preferred embodiment of a cable modem termination system communicating over a hybrid fiber coaxial cable network to a cable modem, but the above described aspects may also be applicable to any signal transmission system that uses modulation schemes having sidebands that transmit information. For example, wireless telephony, satellite communication systems and any other communication system using digital modulation and frequency upconversion components can benefit from the use of the subject matter of the claims below.

What is claimed is:

1. A system for suppressing an undesired signal component of a communication signal, comprising:
    means for tapping a modulated signal output from a modulator and providing a tapped portion of the modulated signal at a tapped signal output of the means for tapping;
    a receiver coupled to the tapped signal output of the means for tapping via a signal input, the receiver, having a control input and a control output, being configured to detect signal voltages representing power levels of selected signal components in the tapped portion in response to a computer instruction that specifies the selected signal component and that is received on the control input; and
    a local RF processor coupled to the receiver's control input and control output, the processor also being coupled to parameter-adjustable components that are coupled to inputs of the modulator, the processor configured to evaluate the detected voltages of the signal components of the communication signal to determine whether the power levels of the signal components are optimized and to instruct the parameter-adjustable components to adjust parameters based on the determined power level of the signal components so that transmission of the communication signal is optimized.

2. The system of claim 1 wherein the local RF processor is configured to provide instruction that specifies that the receiver tune to an evaluation frequency of the tapped portion of the signal.

3. The system of claim 1 wherein the local RF processor is configured to provide instruction to the parameter-adjustable components that are coupled to the modulator to adjust modulating signal parameters based on the power levels of the signal components.

4. The system of claim 1 wherein the parameter-adjustable components include a channel processor.

5. The system of claim 4 wherein the channel processor is a field programmable gate array logic device.

6. The system of claim 1 wherein the parameter-adjustable components include a complex digital to analog converter.

7. The system of claim 1, the tapping means having a passed signal output, further comprising an IF filter coupled to the passed signal output.

8. The system of claim 1 wherein the local RF processor functionality is embodied in a field programmable gate array logic device.

9. The system of claim 8 wherein the field programmable logic gate array also embodies a channel processor.

10. A system for suppressing an undesired signal component of a communication signal comprising:
    means for tapping a signal output from a modulator and providing a tapped portion of the signal output from the modulator at a tapped signal output of the means for tapping;
    a receiver coupled to the tapped output of the means for tapping via a signal input, the receiver, having a control input and a control output, being configured to detect signal voltages representing power levels of selected signal components in the tapped portion in response to a computer instruction that specifies the selected signal component and that is received on the control input;

a local RF processor coupled to the receiver's control input and control output, the local RF processor also being coupled to parameter-adjustable components that are coupled to inputs of the modulator, the processor configured to evaluate the detected voltage levels of the selected signal components of the communication signal, to determine whether the power levels of the selected signal components are optimized and to instruct the parameter-adjustable components to adjust parameters based on the determined power level of the signal components so that transmission of the communication signal is optimized;

a main processor coupled to the RF processor configured to instruct the RF processor when to evaluate signal component power level; and a memory coupled to the local RF processor configured to store a control program that manages the processor operations of evaluating signal component power levels, of determining whether the power levels are optimized and of instructing the parameter-adjustable components to adjust parameters.

11. The system of claim 10 wherein the local RF processor is configured to provide instruction that specifies that the receiver tune to an evaluation frequency of the tapped portion of the signal.

12. The system of claim 10 wherein the local RF processor is configured to provide instruction to the parameter-adjustable components that are coupled to the modulator to adjust modulating signal parameters based on the power levels of the sidebands.

13. The system of claim 10 wherein the parameter-adjustable components include a channel processor.

14. The system of claim 13 wherein the channel processor is a field programmable gate array logic device.

15. The system of claim 10 wherein the parameter-adjustable components include a complex digital to analog converter.

16. The system of claim 10 wherein the local RF processor is a field programmable gate array logic device.

17. A method for managing and optimizing signal component power levels of a modulated communication signal, comprising:

receiving a power level detection interrupt at a local processor from a main processor;

determining the power level of one or more desired signal components of corresponding one or more modulated communication signals;

evaluating the relative power levels of the one or more desired signal components;

adjusting parameters of parameter-adjustable components in response to the evaluation of the relative power levels;

determining the power levels of one or more undesired signal components of corresponding one or more modulated communication signals;

evaluating the power levels of the one or more undesired signal components versus the evaluated power levels of the one or more desired signal components that correspond to the undesired signal component being evaluated, and adjusting parameters of parameter-adjustable components in response to the evaluation of the power levels of the undesired signal components.

18. The method of claim 17 wherein the evaluation of undesired signal components results in a ratio of desired component power level to undesired component power level.

19. The method of claim 17 wherein the parameters are adjusted during each iteration of an iterative evaluation of the power levels to optimize transmission of the communication signal.

20. The method of claim 17 wherein the steps of determining the power levels of signal components includes tuning an IF receiver to a frequency centered in an evaluation frequency range specified in a computer instruction from a local processor.

* * * * *